United States Patent
Deval et al.

(10) Patent No.: US 8,735,979 B2
(45) Date of Patent: May 27, 2014

(54) MULTI-CHANNEL HOMOGENOUS PATH FOR ENHANCED MUTUAL TRIGGERING OF ELECTROSTATIC DISCHARGE FINGERS

(75) Inventors: Philippe Deval, Lutry (CH); Marija Fernandez, Lausanne (CH); Patrick Besseux, Mont-sur Rolle (CH)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 13/552,751

(22) Filed: Jul. 19, 2012

(65) Prior Publication Data

US 2013/0020646 A1    Jan. 24, 2013

Related U.S. Application Data

(60) Provisional application No. 61/510,357, filed on Jul. 21, 2011.

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl.
USPC .................. 257/335; 257/E27.017

(58) Field of Classification Search
USPC .......................... 257/355, E27.017
See application file for complete search history.

(56) References Cited

U.S. PATENT DOCUMENTS

| 5,811,856 | A | 9/1998 | Lee ............................... 257/355 |
| 6,444,510 | B1 | 9/2002 | Hu et al. ....................... 438/197 |
| 7,764,475 | B2 * | 7/2010 | Sung et al. ..................... 361/56 |
| 8,022,498 | B1 * | 9/2011 | Khieu et al. ................... 257/499 |
| 2004/0052020 | A1 | 3/2004 | Ker et al. ......................... 361/56 |
| 2008/0144244 | A1 | 6/2008 | Van Camp ...................... 361/56 |
| 2008/0151446 | A1 | 6/2008 | Ker et al. ......................... 361/56 |
| 2008/0232013 | A1 * | 9/2008 | Ker et al. ......................... 361/56 |

OTHER PUBLICATIONS

International Search Report, Application No. PCT/US2012/047391, 6 pages, Jan. 4, 2013.
Invitation to Pay Additional Fees and, Where Applicable, Protest Fee; PCT/US2012/047391, 8 pages, Oct. 15, 2012.

* cited by examiner

*Primary Examiner* — David S Blum
(74) *Attorney, Agent, or Firm* — King & Spalding L.L.P.

(57) ABSTRACT

Mutual triggering of electrostatic discharge (ESD) fingers is improved by creating a base contact in each individual finger and connecting all of these base contacts in parallel. The local base contact in each ESD finger is located at a position where the base voltage significantly increases when the ESD current increases. Thus when an ESD finger is triggered its local base voltage will tend to significantly increase. Since all of the ESD finger bases are connected in parallel this local voltage increase will forward bias the base-emitter junctions of the other ESD fingers, thus triggering them all. By sharing the triggering current from the fastest ESD finger with the slower ones ensures that all ESD fingers are triggered during an ESD event.

30 Claims, 12 Drawing Sheets

MULTI-CHANNEL HOMOGENOUS PATH FOR ENHANCED MUTUAL TRIGGERING OF ELECTROSTATIC DISCHARGE FINGERS

RELATED PATENT APPLICATION

This application claims priority to commonly owned U.S. Provisional Patent Application Ser. No. 61/510,357; filed Jul. 21, 2011; entitled "Multi-Channel Homogenous Path for Enhanced Mutual Triggering of Electrostatic Discharge Fingers," by Philippe Deval, Fernandez Marija and Besseux Patrick; which is hereby incorporated by reference herein for all purposes.

TECHNICAL FIELD

The present disclosure relates to high voltage (HV) metal oxide semiconductor (MOS) devices, and more particularly, to providing enhanced electrostatic discharge (ESD) protection for the HV MOS devices.

BACKGROUND

CAN Controller-area network (CAN or CAN-bus) is a vehicle bus standard designed to allow microcontrollers and devices to communicate with each other within a vehicle without a host computer. CAN is a message-based protocol designed specifically for automotive applications but is now also used in other areas such as industrial automation and medical equipment. The LIN-Bus (Local Interconnect Network) is a vehicle bus standard or computer networking bus-system used within current automotive network architectures. The LIN specification is enforced by the LIN-consortium. The LIN bus is a small and slow network system that is used as a cheap sub-network of a CAN bus to integrate intelligent sensor devices or actuators in today's vehicles. The automotive industry is beginning to require higher than the standard 4 kV HBM ESD target. Current information indicates that greater than 6 kV is required (targeting 8 kV on the bus pins and SPLIT pin). Also, the industry may subject the device to system level tests as defined by IEC 801 and IEC 61000-4-2. Therefore it is necessary to meet IEC 1000-4-2:1995 specifications, as well as the following reliability specifications on all pins of an integrated circuit device used in a CAN and/or LIN system: ESD: EIA/JESD22 A114/A113; ESD: IEC 1000-4-2:1995.

High energy ESD discharge (8 KV HBM/6 KV IEC 61000.4) induces high current peak flowing in the ESD protection (up to 20 A@6 KV IEC 61000.4). Adding a 220 pF load capacitor in parallel with the integrated circuit device signal pad for protection (Automotive requirement) significantly amplifies this current peak (discharge current of this capacitor adds to the ESD current and there is substantially no series resistance with this load capacitor to limit its discharge current when the ESD circuit snaps back).

SUMMARY

Therefore what is needed is a more robust ESD protection circuit capable of handling enhanced high energy ESD discharge without damage to the protected integrated circuit device.

According to an embodiment, an apparatus for electrostatic discharge (ESD) protection of an integrated circuit pad may comprise: a plurality of ESD fingers (300), wherein each of the plurality of ESD fingers may be coupled to a signal pad connection (323), a distributed base connection (316), a polysilicon layer (322) coupled to a gate connection, and a ground connection (318).

According to a further embodiment, each of the plurality of ESD fingers (300) may comprise: an NMOS device (312) comprising a high voltage (HV) drain formed by an N-well (330) formed in a P-substrate (308) and coupled to the signal pad (323) through an N+diffusion contact (332) in the N-well (330), a gate formed by the polysilicon layer (322) over the P-substrate (308) and insulated therefrom by a thin oxide layer therebetween, and a source formed by a first N+diffusion contact (302) in the P-substrate (308) and coupled to the distributed base connection (316); a first NPN bipolar device (306) comprising a collector formed by the N-well (330), a base formed by the P-substrate (308), and an emitter formed by a second N+diffusion contact (310) in the P-substrate (308) and coupled to the ground connection (318); a second NPN bipolar device (324) comprising a collector formed by the N-well (330), a base formed by the P-substrate (308), and an emitter formed by the first N+diffusion contact (302) in the P-substrate (308) and coupled to the distributed base connection (316); a first P+diffusion contact (314) in the P-substrate (308) and coupled to the distributed base connection (316), wherein the first P+diffusion contact (314) may be butted proximate to the first N+diffusion contact (302); and a second P+diffusion contact (320) in the P-substrate (308) and coupled to the ground connection (318).

According to a further embodiment, the second NPN bipolar device (324) may be a secondary contribution NPN bipolar device to the first NPN bipolar device (306). According to a further embodiment, a first resistor (328) may be formed in the P-substrate (308) that couples the bases of the first NPN bipolar device (306) and the second NPN bipolar device (324) to the first P+diffusion contact (314); and a second resistor (326) may be formed in the P-substrate (308) that couples the base of the first NPN bipolar device (306) and the second NPN bipolar device (324) to the second P+diffusion contact (320).

According to a further embodiment, the first base resistor (328) may be an unwanted parasitic resistor while second base-emitter resistor (326) may be desired. According to a further embodiment, the first base resistor (328) connects the bases of the first NPN bipolar device (306) and the second NPN bipolar device (324) to the distributed base connection (316). According to a further embodiment, the second resistor (326) may be higher in resistance than the first resistor (328) for maximizing mutual triggering of the plurality of ESD fingers (300). According to a further embodiment, the gate formed by the polysilicon layer (322) may be coupled to the distributed base connection (316). According to a further embodiment, the gate formed by the polysilicon layer (322) may be coupled to the distributed base connection (316)) through a resistor. According to a further embodiment, the gate formed by the polysilicon layer (322) may be coupled to the ground connection (318) through a resistor. According to a further embodiment, the gate formed by the polysilicon layer (322) may be coupled to the ground connection (318). According to a further embodiment, the gate formed by the polysilicon layer (322) may be coupled to an ESD clamp triggering circuit (110).

According to a further embodiment, each of the plurality of ESD fingers (400a) may comprise: an NMOS device (312) comprising a high voltage (HV) drain formed by an N-well (330a) butted to a P-well body (308a) and coupled to the signal pad (323) through an N+diffusion contact (332) in the N-well (330a), a gate formed by the polysilicon layer (322) over the P-well body (308a) and insulated therefrom by a thin oxide layer therebetween, and a source formed by a first N+diffusion contact (302) in the P-well body (308a) and coupled to the distributed base connection (316); a first NPN bipolar device (306) comprising a collector formed by the N-well (330a), a base formed by the P-well body (308a), and an emitter formed by a second N+diffusion contact (310) in the P-well body (308a) and coupled to the ground connection (318); a second NPN bipolar device (324) may comprise a collector formed by the N-well (330a), a base formed by the P-well body (308a), and an emitter formed by the first N+diffusion contact (302) in the P-well body (308b) and coupled to the distributed base connection (316); a first P+diffusion contact (314) in the P-well body (308a) and coupled to the distributed base connection (316), wherein the first P+diffusion contact (314) may be butted proximate to the first N+diffusion contact (302); a second P+diffusion contact (320) in the P-well body (308a) and coupled to the ground connection (318); and an isolation substrate (334) having the P-well body (308a) and the N-well (330a) deposed thereon.

According to a further embodiment, the second NPN bipolar device (324) may be a secondary contribution NPN bipolar device to the first NPN bipolar device (306). According to a further embodiment, the signal pad connection (323) may be connected to a positive supply while the ground connection (318) may be connected to a signal pad to be protected. According to a further embodiment, a first resistor (328) may be formed in the P-well body (308a) that couples the bases of the first NPN bipolar device (306) and the second NPN bipolar device (324) to the first P+diffusion contact (314); and a second resistor (326) may be formed in the P-well body (308a) that couple the bases of the first NPN bipolar device (306) and the second NPN bipolar device (324) to the second P+diffusion contact (320).

According to a further embodiment, the first base resistor (328) may be an unwanted parasitic resistor while the second base-emitter resistor (326) may be a desired parasitic resistor. According to a further embodiment, the second resistor (326) may be higher in resistance than the first resistor (328) for maximizing mutual triggering of the plurality of ESD fingers (400a). According to a further embodiment, the gate formed by the polysilicon layer (322) may be coupled to the distributed base connection (316). According to a further embodiment, the gate formed by the polysilicon layer (322) may be coupled to the ground connection (318) through a resistor. According to a further embodiment, the gate formed by the polysilicon layer (322) may be coupled to an ESD clamp triggering circuit (110).

According to a further embodiment, each of the plurality of ESD fingers (400b) may comprise: an NMOS device (312) comprising a high voltage (HV) drain formed by a deep N-well (330b) surrounding a P-well body (308b) and coupled to the signal pad connection (323) through an N+diffusion contact (332) in the deep N-well (330b), a gate formed by the polysilicon layer (322) over the P-well body (308b) and insulated therefrom by a thin oxide layer therebetween, and a source formed by a first N+diffusion contact (302) in the P-well body (308b) and coupled to the distributed base connection (316); a first NPN bipolar device (306) comprising a collector formed by the deep N-well (330b), a base formed by the P-well body (308b), and an emitter formed by a second N+diffusion contact (310) in the P-well body (308b) and coupled to the ground connection (318); a second NPN bipolar device (324) comprising a collector formed by the deep N-well (330b), a base formed by the P-well body (308b), and an emitter formed by the first N+diffusion contact (302) in the P-well body (308b) and coupled to the distributed base connection (316); a first P+diffusion contact (314) in the P-well body (308b) and coupled to the distributed base connection (316), wherein the first P+diffusion contact (314) may be butted proximate to the first N+diffusion contact (302); a second P+diffusion contact (320) in the P-well body (308b) and coupled to the ground connection (318); and a P-substrate (308) having the deep N-well (330b) formed therein.

According to a further embodiment, the second NPN bipolar device (324) may be a secondary contribution NPN bipolar device to the first NPN bipolar device (306). According to a further embodiment, the first base resistor (328) may be an unwanted parasitic resistor while second base-emitter resistor (326) may be a desired parasitic resistor. According to a further embodiment, the second resistor (326) may be higher in resistance than the first resistor (328) for maximizing mutual triggering of the plurality of ESD fingers (400b). According to a further embodiment, the gate formed by the polysilicon layer (322) may be coupled to the distributed base connection (316). According to a further embodiment, the gate formed by the polysilicon layer (322) may be coupled to the distributed base connection (316) through a resistor. According to a further embodiment, the gate formed by the polysilicon layer (322) may be coupled to the ground connection (318) through a resistor. According to a further embodiment, the gate formed by the polysilicon layer (322) may be coupled to the ground connection (318). According to a further embodiment, the gate formed by the polysilicon layer (322) may be coupled to an ESD clamp triggering circuit (110). According to a further embodiment, the signal pad connection (323) may be connected to a positive supply while the ground connection (318) may be connected to a signal pad to be protected.

According to another embodiment, an apparatus for electrostatic discharge (ESD) protection of an integrated circuit pad may comprise: a plurality of ESD fingers (400c), wherein each of the plurality of ESD fingers (400c) may be coupled to a signal pad connection (423), a distributed base connection (416), a polysilicon layer (422) coupled to a gate connection, and a ground connection (418); wherein each of the plurality of (400c) may comprise: an PMOS device (412) comprising a drain formed by a P-well (430c) formed in a deep N-well (408c) and coupled to a ground pad (418) through an P+diffusion contact (432) in the P-well (430c), a gate formed by the polysilicon layer (422) over the deep N-well (408c) and insulated therefrom by a thin oxide layer therebetween, and a source formed by a first P+diffusion contact (402) in the deep N-well (408c) and coupled to the distributed base connection (416); a first PNP bipolar device (406) comprising a collector formed by the P-well (430c), a base formed by the deep N-well (408c), and an emitter formed by a second P+diffusion contact (410) in the deep N-well (408c) and coupled to the signal pad connection (423); a second PNP bipolar device (424) comprising a collector formed by the P-well (430c), a base formed by the deep N-well (408c), and an emitter formed by the first P+diffusion contact (402) in the deep N-well (408c) and coupled to the distributed base connection (416); a first N+diffusion contact (414) in the deep N-well (408c) and coupled to the distributed base connection (416), wherein the first N+diffusion contact (414) may be butted proximate to the first P+diffusion contact (402); and a second N+diffusion contact (420) in the deep N-well (408c) and coupled to the signal pad connection (423).

According to a further embodiment, the second PNP bipolar device (424) may be a secondary contribution PNP bipolar device to the first PNP bipolar device (406). According to a further embodiment, a first resistor (428) may couple the bases of the first PNP bipolar device (406) and the second PNP bipolar device (424) to the first N+diffusion contact (414). According to a further embodiment, a second resistor (426) may couple the bases of the first PNP bipolar device (406) and the second PNP bipolar device (424) to a second N+diffusion contact (420), wherein the second resistor (426) may be higher in resistance than the first resistor (428) for maximizing mutual triggering of the plurality of ESD fingers (400*c*). According to a further embodiment, the first base resistor (428) may be an unwanted parasitic resistor while second base-emitter resistor (426) may be a desired parasitic resistor. According to a further embodiment, the gate formed by the polysilicon layer (422) may be coupled to the distributed base connection (416). According to a further embodiment, the gate formed by the polysilicon layer (422) may be coupled to the distributed base connection (416) through a resistor. According to a further embodiment, the gate formed by the polysilicon layer (422) may be coupled to the ground connection (418) through a resistor. According to a further embodiment, the gate formed by the polysilicon layer (422) may be coupled to the ground connection (418). According to a further embodiment, the gate formed by the polysilicon layer (422) may be coupled to an ESD clamp triggering circuit (110). According to a further embodiment, the signal pad connection (423) may be connected to a positive supply while the ground connection (418) may be connected to a signal pad to be protected.

According to yet another embodiment, an apparatus for electrostatic discharge (ESD) protection of an integrated circuit pad may comprise: a plurality of ESD fingers (400*d*), wherein each of the plurality of ESD fingers (400*d*) may be coupled to a signal pad connection (423), a distributed base connection (416), a polysilicon layer (422) coupled to a gate connection, and a ground connection (418); wherein each of the plurality of ESD fingers (400*d*) may comprise: a PMOS device (412) comprising a drain formed by first P+diffusion contact (432) formed in a P-well (430*d*) formed in a deep N-well (408*d*) and coupled to a ground pad (418), a gate formed by the polysilicon layer (422) over the deep N-well (408*d*) and insulated therefrom by a thin oxide layer therebetween, and a source formed by a second P+diffusion contact (442) in the deep N-well (408*c*) and coupled to the signal pad connection (423); an NPN bipolar device (406) comprising a collector formed by the deep N-well (408*d*) and coupled to the signal pad connection (423) through the second N+diffusion contact (444), a base formed by the P-well (430*d*) that may be formed in the deep N-well (408*d*), and an emitter formed by a first N+diffusion (410) built inside the P-well (430*d*), and coupled to the ground connection (418; a third P+diffusion contact (414) in the P-well (430*d*) and coupled to the distributed base connection (416); a first P+diffusion contact (432) formed in the P-well (430*d*) and acting as the base contact (426) to the ground connection (418); and a P-substrate having the deep N-well (408*d*) formed therein.

According to a further embodiment, a first resistor (428) may be formed between the base of the NPN bipolar device (406) and the first P+diffusion contact (414). According to a further embodiment, a second resistor (426) may be formed between the base of the NPN bipolar device (406) and the first P+diffusion contact (432) formed in the P-well (430*d*) and coupled to the ground pad connection (18), wherein the second resistor (426) may be higher in resistance than the first resistor (428) for maximizing mutual triggering of the plurality of ESD fingers (400*d*). According to a further embodiment, the first base resistor (428) may be an unwanted parasitic resistor while second base-emitter resistor (426) may be a desired parasitic resistor. According to a further embodiment, the gate formed by the polysilicon layer (422) may be coupled to the pad connection (423). According to a further embodiment, the gate formed by the polysilicon layer (422) may be coupled to the pad connection (423) through a resistor. According to a further embodiment, the gate formed by the polysilicon layer (422) may be coupled to the pad connection (423). According to a further embodiment, the gate formed by the polysilicon layer (422) may be coupled to an ESD clamp triggering circuit (110). According to a further embodiment, the signal pad connection (423) may be connected to a positive supply while the ground connection (418) may be connected to a signal pad to be protected.

According to still another embodiment, an apparatus for electrostatic discharge (ESD) protection of an integrated circuit pad may comprise: a plurality of ESD fingers (900), wherein each of the plurality of ESD fingers (900) may be coupled to a signal pad connection (923), a distributed base connection (916), and a ground connection (918); wherein each of the plurality of ESD fingers (900) may comprise: an NPN bipolar device (906) comprising a collector formed by a first N+diffusion contact (932) formed in an N-well (930) formed in a P-substrate (908) and coupled to the signal pad connection (923), a base formed in the P-substrate (908), and an emitter formed by a second N+diffusion contact (910) formed in the P-substrate (908) and coupled to the ground connection (918).

According to a further embodiment, a first resistor (928) may be formed between the base of the NPN bipolar device (906) and a first P+diffusion contact (914). According to a further embodiment, a second resistor (926) may be formed between the base of the NPN bipolar device (906) and a second P+diffusion contact (920) coupled to the ground connection (918), wherein the second resistor (926) may be higher in resistance than the first resistor (928) for maximizing mutual triggering of the plurality of ESD fingers (900). According to a further embodiment, the first base resistor (928) may be an unwanted parasitic resistor while second base-emitter resistor (926) may be a desired parasitic resistor.

According to another embodiment, an apparatus for electrostatic discharge (ESD) protection of an integrated circuit pad may comprise: a plurality of ESD fingers (1000), wherein each of the plurality of ESD fingers (1000) may be coupled to a signal pad connection (1023), a distributed base connection (1016), and a ground connection (1018); wherein each of the plurality of ESD fingers (1000) may comprise: a PNP bipolar device (1006) comprising a collector formed by the P-substrate (1008) and coupled to the ground connection (1018) through a first P+diffusion contact (1032) formed in the P-substrate (1008), a base formed by an N-well (1030) and coupled to the distributed base connection (1016) through a first N+diffusion contact (1014) formed in the N-well (1030) and coupled to the pad connection (1023) through a second N+diffusion contact (1020) formed in the N-well (1030), and an emitter formed by a second P+diffusion contact (1010) formed in the N-well base (1030) and coupled to the signal pad connection (1023).

According to a further embodiment, a first resistor (1028) may be formed between the base of the PNP bipolar device (1006) and the first N+diffusion contact (1014). According to a further embodiment, a second resistor (1026) may be formed between the base of the PNP bipolar device (1006) and a second N+diffusion contact (1020) formed in the N-well (1030) and coupled to the signal pad connection (1023), wherein the second resistor (1026) may be higher in resistance than the first resistor (1028) for maximizing mutual triggering of the plurality of ESD fingers (1000). According to a further embodiment, the first base resistor (1028) may be an unwanted parasitic resistor while second base-emitter resistor (1026) may be a desired a parasitic resistor.

According to another embodiment, an apparatus for electrostatic discharge (ESD) protection of an integrated circuit pad may comprise: a plurality of ESD fingers (1100), wherein each of the plurality of ESD fingers (1100) may be coupled to a signal pad connection (1123), a distributed base connection (1116), and a ground connection (1118); wherein each of the plurality of ESD fingers (1100) may comprise: an NPN bipolar device (1106) comprising a collector formed by a deep N-well (1108) and coupled to the signal pad connection (1123) through a second N+diffusion contact (1144), a base formed by a P-well (1130) formed in the deep N-well (1108) and coupled to the distributed base connection (1116) through a first P+diffusion contact (1114) formed in the P-well (1130) and coupled to the ground connection (1118) through a second P+diffusion contact (1132) formed in the P-well (1130), and an emitter formed by a first N+diffusion (1110) formed inside the P-well (1130), and coupled to the ground connection (1118); and a P-substrate having the deep N-well (1108) formed therein.

According to a further embodiment, a first resistor (1128) may be formed between the base of the NPN bipolar device (1106) and the first P+diffusion contact (1114). According to a further embodiment, a second resistor (1126) may be formed between the base of the NPN bipolar device (1106) and the second P+diffusion contact (1132) formed in the P-well (1130), wherein the second resistor (1126) may be higher in resistance than the first resistor (1128) for maximizing mutual triggering of the plurality of ESD fingers (1100). According to a further embodiment, the first base resistor (1028) may be an unwanted parasitic resistor while second base-emitter resistor (1026) may be a desired parasitic resistor. According to a further embodiment, the signal pad connection (1123) may be connected to a positive supply while the ground connection (1118) may be connected to a signal pad to be protected.

BRIEF DESCRIPTION OF THE DRAWINGS

A more complete understanding of the present disclosure may be acquired by referring to the following description taken in conjunction with the accompanying drawings wherein.

Figure 1:
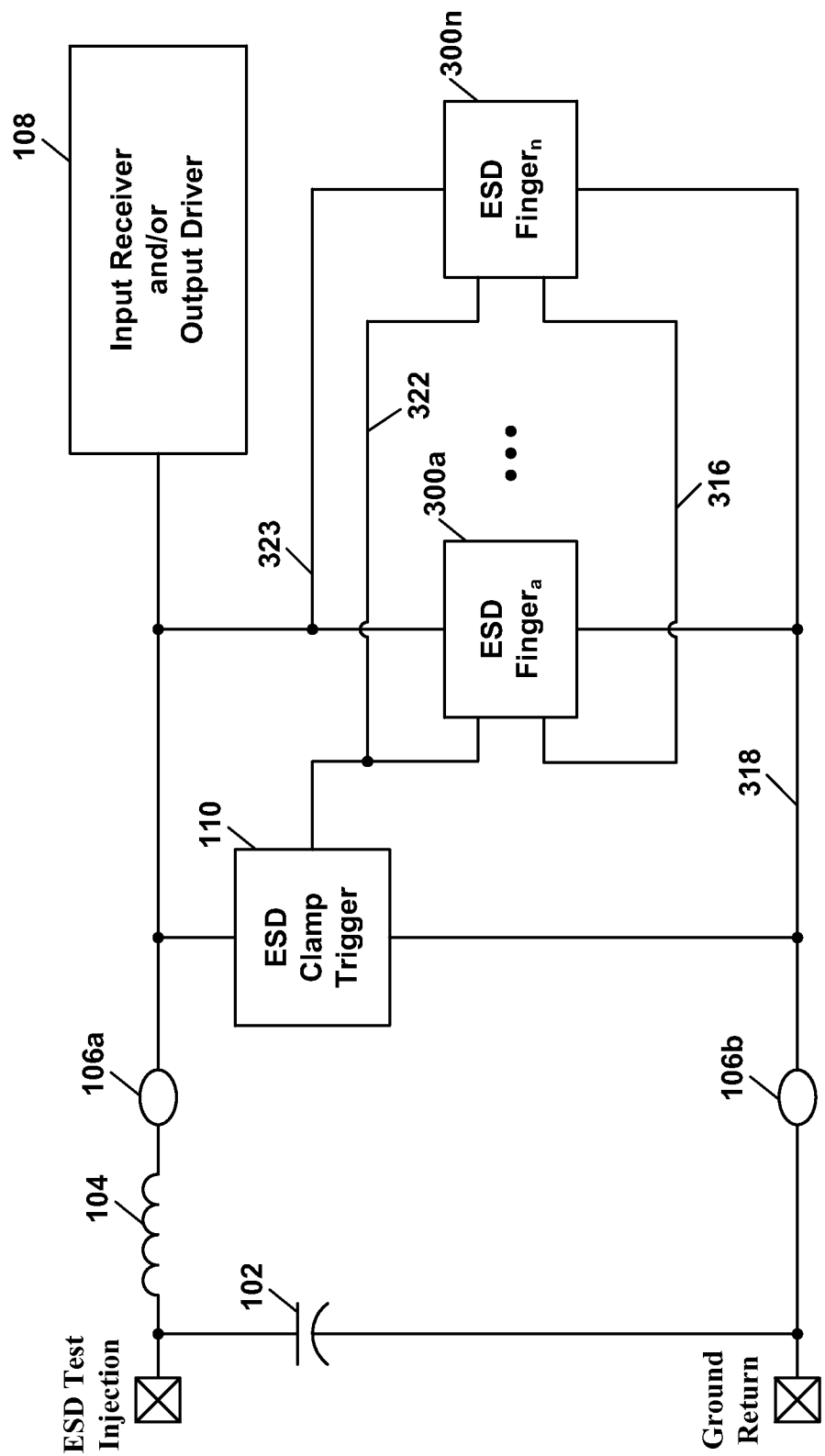
FIG. 1 illustrates a schematic block diagram of an electrostatic discharge (ESD) protection circuit having a plurality of ESD protection fingers fabricated in an integrated circuit die, according to the teachings of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

High ESD energy bypassing in ESD protection devices requires wide devices that can only be achieved through multiple elementary devices connected in parallel. Such elementary devices will hereinafter be referred to as "fingers." Maximum efficiency is achieved when all of these fingers in parallel are triggering together. Under certain discharge conditions only a few, even a single finger(s), is (are) triggered. Thus ESD protection efficiency is dramatically reduced.

ESD protection mainly relies on the inherent companion bipolar device to the MOS device. Usually grounded gate N-type metal-oxide-semiconductor (NMOS) are used as ESD devices Inherent bipolar companion device to the grounded gate NMOS device is an NPN device. A grounded gate (GG) NMOS device is an NMOS device having its gate connected to its source terminal directly or through a grounding gate resistance, the source node being connected to the ground. The drain and source nodes of the NMOS transistor, that are N-type doped islands diffused into a P-substrate (or Pbody), constitute the collector and emitter terminal of the NPN bipolar companion device while the P-substrate (or Pbody) constitutes the base of this NPN bipolar companion device. The greater the base voltage, the greater the collector current.

The GGNMOS device operates as follows when a positive ESD event occurs: Applying the positive discharge to the drain of the GGNMOS device induces a fast increase of the drain voltage of this device. Very quickly the drain voltage reaches the break-down voltage of the drain-to-Pbody junction. This induces a break-down current into the Pbody that flows to the ground through the Pbody contact (P+ diff tie). The current flow induces a voltage drop into the Pbody due to inherent resistance of the Pbody. This voltage drop induces a base-emitter current as soon as it reaches a junction voltage (~0.7V) in the source area that is as well the companion NPN emitter region. This base-emitter current is amplified by the beta factor of the companion NPN device thereby inducing an increase of the current flowing into the Pbody as well as the voltage drop. As a matter of fact the base current increases thereby inducing a positive feedback effect commonly known as an "avalanche effect." From this point the current increases very quickly and the drain voltage collapses down to a voltage hereinafter referred to as a "holding voltage." The drain voltage from which the avalanche effect starts is hereinafter referred to as a "snapback voltage" or "triggering voltage."

All fingers must trigger simultaneously for maximizing the ESD robustness. However the ESD current concentrates into the fastest fingers since the base voltage of the fastest fingers increases faster than the base voltage of the slowest ones due to larger current in the fastest fingers. Non-uniform finger triggering results in degraded HV ESD protection: High voltage ESD protection circuits usually have a hold voltage dramatically lower than the snapback voltage. Thus once one finger triggers, it tends to sink the entire current since the voltage on the pin drops at a level from which the other fingers cannot snapback. Techniques, like drain-to-gate capacitive coupling, exist for improving simultaneous triggering of the fingers. Increasing the ballast resistors also helps. However, under certain discharge conditions, e.g., IEC61000-4-2 with 220 pF load capacitor on the signal pad, these techniques are no longer sufficient. The main reason for which some fingers are not triggering is that the minimum energy (base current) required to trigger these fingers wasn't injected/accumulated in their bases when the faster finger starts snapping back and dropping out the integrated circuit signal pad (pin) voltage. This base current is injected through the leakage current of the drain junction when its voltage is close to its break-down. Thus dropping the signal pad (pin) voltage stops the leakage and base current injection.

Figure 2:
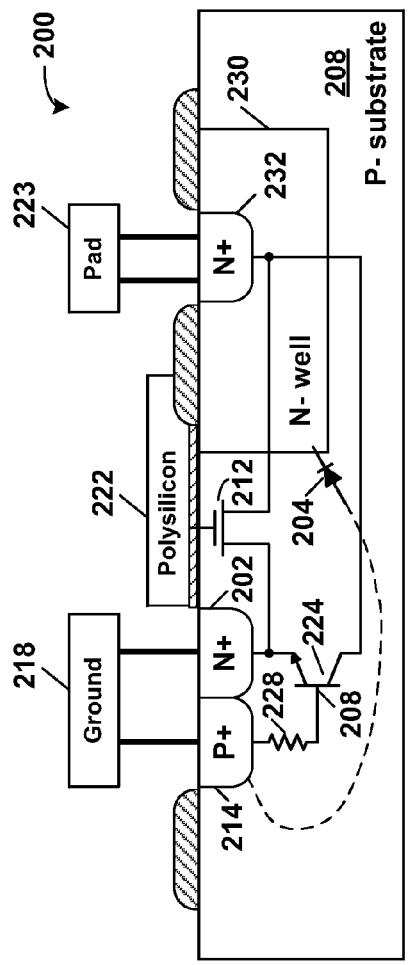
FIG. 2 illustrates a schematic cross-section elevational diagram of a prior art grounded gate N-type metal-oxide-semiconductor (NMOS) ESD protection circuit fabricated in an integrated circuit die.
Figure 3:
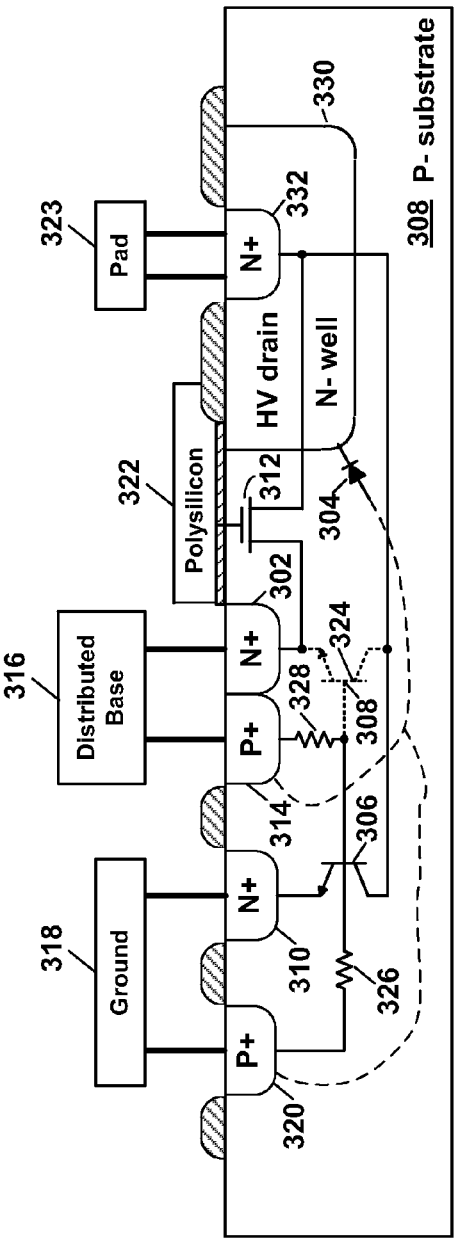
FIG. 3 illustrates a schematic cross-section elevational diagram of a grounded gate NMOS ESD protection circuit fabricated in an integrated circuit die, according to a specific example embodiment of this disclosure.
Figure 7:
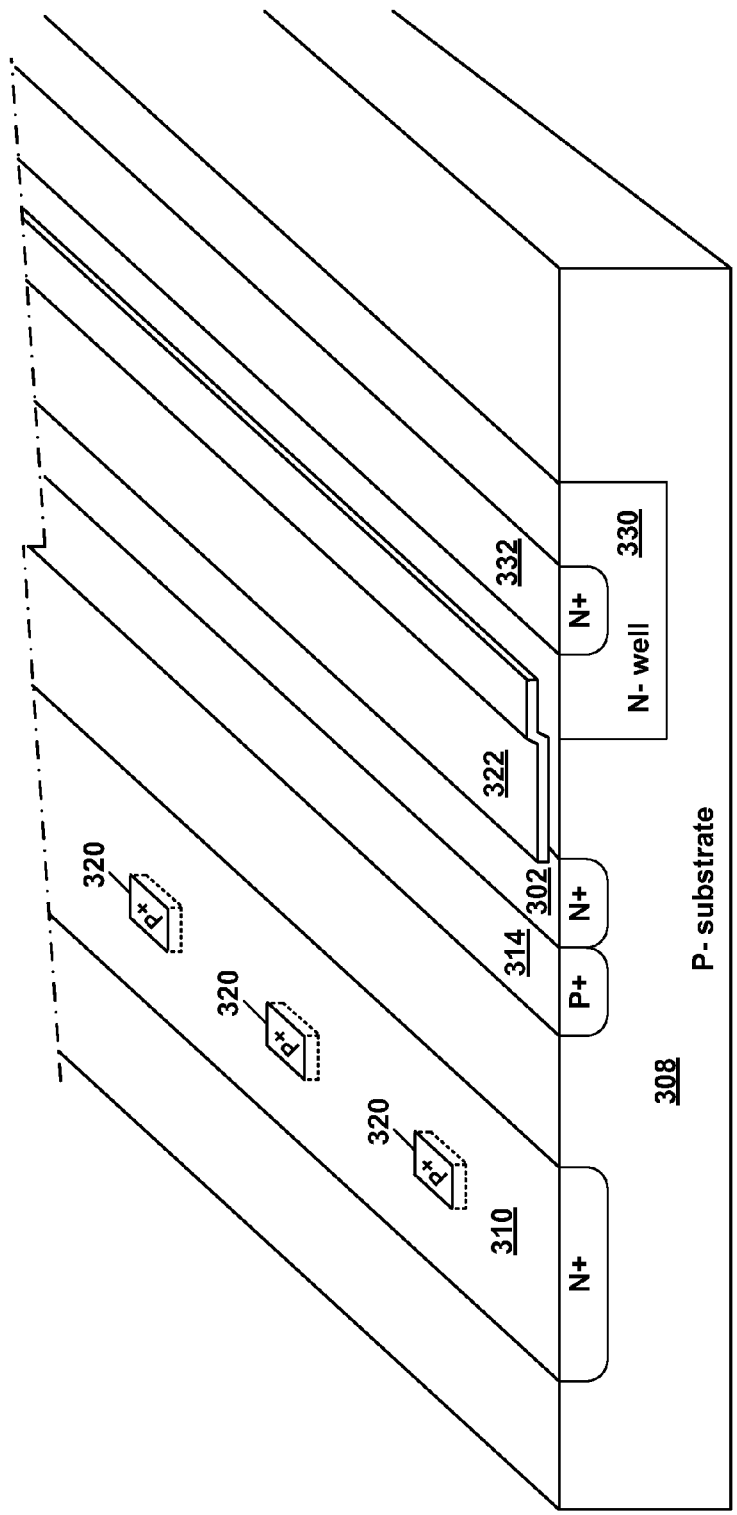
FIG. 7 illustrates a schematic isometric diagram of the grounded gate NMOS ESD protection circuit shown in FIG. 3.

According to the teachings of this disclosure, mutual triggering of the fingers is improved by homogenizing the base voltage of each finger. This implies that all of the bases are to be connected together which is not the case with the prior art. This is achieved by modifying the ground connection as shown in FIG. 3. The N+ source 302 and local P+ body connection 314 are no longer connected to the ground line as done in the prior art through N+ source/emitter 202 and local P+ body/base connection 214 (FIG. 2). The N+ source 302 and local P+ body connection 314 become the local base contact. It is connected to a "distributed base" 316. Ideally all of the local bases should be connected together with "strong metal" (low resistance) connections. However there is inherent resistance in the distributed base connection 316 that is represented by a series resistance 328 (also, e.g., the ground return resistance 228 shown in FIG. 2). Care must be taken to minimize the series resistance 328. This is why the N+ source 302 and local P+ body/base diffusion are preferably butted together (placed next to each other). An N+ diffusion 310 is added in order to create the emitter of the main ESD NPN bipolar device 306. The emitter contact is created by adding the N+ diffusion 310. The inherent companion NPN device 324 thereby becomes mainly parasitic. A weak ground return path needs to be created in order to prevent small leakage current in the P-substrate/Pbody from triggering the ESD protection. This weak ground return path is achieved through the P+substrate contact 320 and inherent base grounding resistance. In order to maximize mutual finger triggering through the base current this base grounding resistance needs to be large compared to the series resistance 328. This will minimize the resistive divider effect between series resistance 328 of the fastest finger and the parallel association of the grounding resistance 316 of all other fingers. This weak ground-return path/large grounding resistance 326 is achieved by placing only a few minimally sized grounding P+ substrate contact islands 320 (FIG. 7). By contrast the N+ emitter diffusion 310 shall be wide (FIG. 7). One way to create the weak ground return path and wide emitter diffusion in a minimal area is by creating a few minimally sized P+ diffusion islands inside the wide N+ emitter diffusion as shown in FIG. 7. The local base contact in each finger is located at a position where the base voltage significantly increases when the ESD current increases. Thus when a finger is triggered its local base voltage will tend to significantly increase. Since all of the finger bases are connected in parallel this local voltage increase will forward bias the base-emitter junctions of the other fingers, thus triggering them all. By sharing the triggering current from the fastest ESD finger with the slower ones ensures that all fingers are triggered during an ESD event.

Figure 4A:
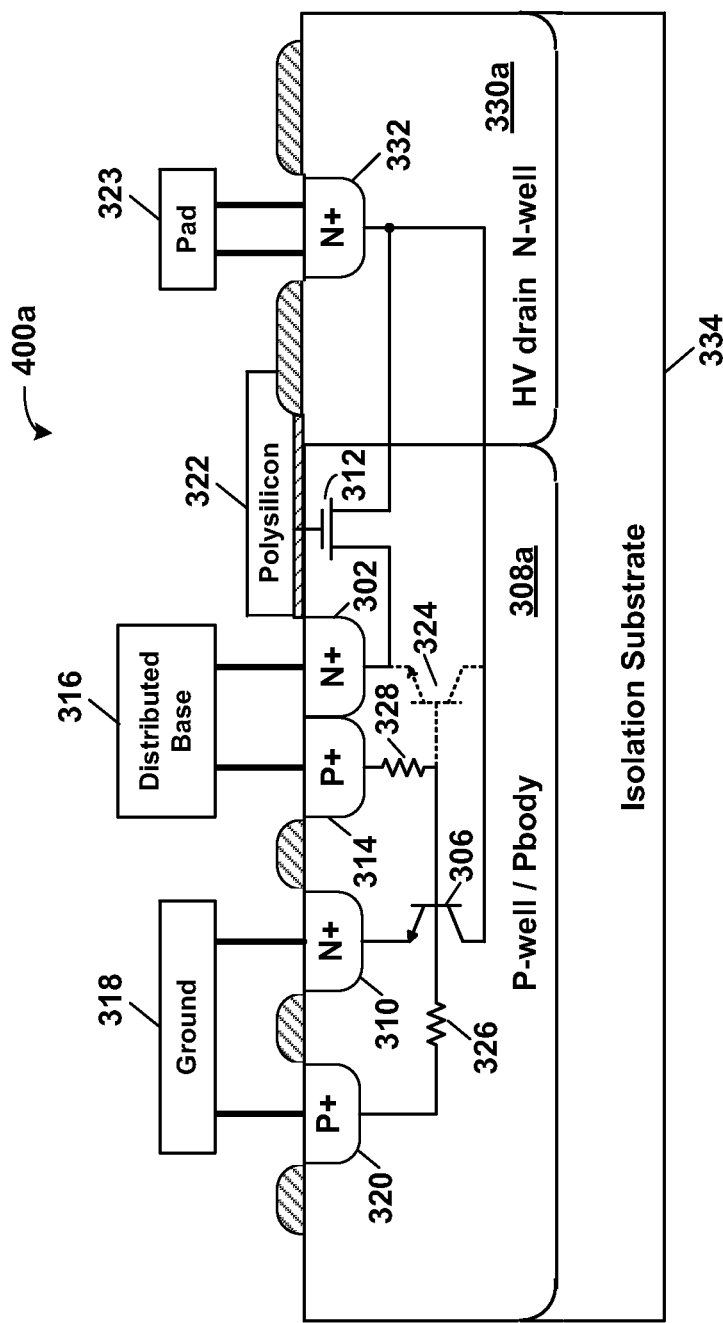
FIG. 4A illustrates a schematic cross-section elevational diagram of a grounded gate NMOS ESD protection circuit on an isolated substrate and fabricated in an integrated circuit die, according to another specific example embodiment of this disclosure.

In some processes, like SOI process, the N-Well HV drain is no longer built inside the P-substrate, but is butted to the P-Well/Pbody 308 of GGNMOS (that is as well 306 NPN base as explained hereinabove) as shown in FIG. 4A. This has no significant impact of the overall behavior of the invention, according to the teachings of this disclosure.

GGNMOS ESD protection is based on an NMOS device (LV/HV) having its gate grounded (tied to its source/body potential). The NMOS device has an intrinsic NPN companion device. The NMOS body is the base of the NPN companion device while the drain and source constitute the collector and emitter terminals, respectively. This NMOS device is normally off, but when its drain voltage increases and reaches the drain-to-body breakdown, carriers are injected into the base of the companion NPN device and thus forward biases the base-emitter junction thereof. This creates a collector current that injects more current in the base that is equal to or greater than a voltage that enables an avalanche effect and the device snaps back. From this moment the current increases very quickly.

Referring now to the drawing, the details of a specific example embodiment is schematically illustrated. Like elements in the drawings will be represented by like numbers, and similar elements will be represented by like numbers with a different lower case letter suffix.

Referring to FIG. 1, depicted is a schematic block diagram of electrostatic discharge (ESD) protection having a plurality of ESD protection fingers fabricated in an integrated circuit die, according to the teachings of this disclosure. The base current of each finger 300 is shared between all the fingers 300a to 300n, thereby improving mutual triggering thereof. When one finger 300 is triggered its base current starts increasing dramatically due to the avalanche effect in this finger. The excess of current is distributed to the other fingers 300 helping them to reach their snapback point. This can be easily implemented with standard HV NMOS devices. The source/base nodes (sb) of the fast and slow fingers 300 are preferably connected together through a strong metal (i.e., very low resistance) distributed base connection 316. Without the strong metal distributed base connection 316, the fast and slow fingers 300 may become decoupled upon an ESD event.

Simulated voltage-time graphs of current sharing were run. In prior art ESD fingers (FIG. 2), the fast finger was 1st/2nd Ipk 3.1/2.9 A, Ppk 125/75 W, for total energy of 760 nano-joules; and for the slow finger(s) 1st/2nd Ipk 2/0.6 A, Ppk 70/10 W, for total energy of 380 nano-joules. In the ESD fingers 300 (FIG. 3), according to the teachings of this disclosure, current sharing in the enhanced mutual triggering of the ESD fingers 300 indicated for the fast finger 1st/2nd Ipk 2.1/1.1 A, Ppk 90/20 W, for total energy of 510 nano-joules; and for the slow finger(s) 1st/2nd Ipk 2/1 A, Ppk 70/15 W, for total energy of 420 nano-joules. A significant difference from the prior art current sharing fingers 200 (FIG. 2).

These simulations showed very significant improvement in the homogeneity of finger currents. However, simulations do not take into account self heating that increases finger current mismatch. Current mismatch depends mainly on the transit time of the bipolar devices (e.g., 0.35 ns fast fingers, 0.5 ns slow fingers). The 220 picoFarad load capacitance 102 required by the automotive industry combined with the package plus printed circuit board (PCB) line inductance 104 creates local energy storage plus ringing that further increases the stress on the ESD protection devices (as connected to integrated circuit signal pads 106). Thus the best possible homogeneity of ESD finger currents is desired. The aforementioned ESD circuit improvements, which were motivated for automotive applications, also apply to finger currents homogeneity improvement for any other type of systems as well. According to the current simulations the ESD capability may be increased by about 50 percent.

Referring to FIGS. 2 and 3, depicted are schematic cross-section elevational diagrams for comparison purposes of a prior art grounded gate (GG) NMOS ESD protection circuit (FIG. 2), and, according to the teachings of this disclosure, a new, novel and non-obvious grounded gate (GG) NMOS ESD protection circuit (FIG. 3).

As shown in FIG. 2, a high voltage (HV) NMOS device 212 has its source formed from an N+diffusion area local butted source/emitter contact 202. This butted source/emitter contact 202 is connected to a ground connection 218. The drain of the NMOS device 212 is formed by the N-well 230 and is connected to a signal pad 223. A polysilicon layer 222 over a thin oxide forms the gate of the HV MOS device 212. The gate of the HV NMOS device 212 may be connected to the ground connection 218 through a resistor (not shown) or to a triggering circuit 110, e.g., see FIG. 1. A P-body diode 204 is formed between the N-well 230 and the P-substrate 208 which also forms the base of the bipolar transistor 224. Breakdown current will flow through the P-body diode 204.

As shown in FIG. 3, a high voltage (HV) NMOS device 312 drain is connected to a signal pad 323 through an N+diffusion contact 332. A source thereof is formed from an N+diffusion area local butted source/emitter contact 302. This butted source/emitter contact 302 is not connected to the ground connection 318 as shown in FIG. 2 (prior art). Instead the butted source/emitter contact 302 and a local P+diffusion butting contact 314 are connected to a distributed base connection 316. An N+diffusion contact 310 is placed next to the local P+diffusion butting contact 314 and becomes the emitter of the NPN bipolar device 306. The collector of the NPN bipolar device 306 is formed with the N-well 330 which also forms the drain of the HV MOS device 312. This HV-drain/collector is connected to the signal pad 323 through the N+diffusion contact 332. A polysilicon layer 322 over a thin oxide forms the gate of the HV MOS device 312. A second substrate P+diffusion contact 320 is connected to the ground connection 318 and is added next to the N+diffusion contact 310. The N+diffusion contact 310 forms the emitter of the NPN bipolar device 306. The substrate resistance between the second substrate P+diffusion contact 320 and N+diffusion contact (emitter) 310 implements a base-to-emitter resistor 326. The base-to-emitter resistor 326 is needed to prevent early/unwanted triggering on pad glitches. As mentioned hereinabove the base-to-emitter resistor 326 resistor shall be weak (higher resistance) to maximize mutual triggering of the fingers. The gate of the HV NMOS device 312 may be connected to the distributed base connection 316 through a resistor or to an ESD clamp triggering circuit 110, e.g., see FIG. 1. HV-NMOS current induced through appropriate gate coupling significantly helps in delivering a base current into each finger 300, according to the teachings of this disclosure.

A secondary contribution NPN bipolar device 324 is shown in FIG. 3 with dashed lines. The N+diffusion area local butted source/base contact 302 is the emitter of the secondary contribution NPN device 324. When an ESD event occurs, it first triggers the HV NMOS device 312 which pulls up the local bases and thereby turns on the NPN bipolar devices 306 and 324 that will handle most of the ESD event current. Since all the local bases are connected in parallel through the distributed strong base connection 316, the first HV NMOS device 312 that triggers will generate the base current for all of the NPN bipolar devices 306 and 324. Therefore, the respective NPN bipolar devices 306 and 324 of the other ESD fingers will be turned on as well within a small time delay. This may not be as efficient as all ESD fingers simultaneously and naturally triggering, but is much better then only triggering a single one or just a few ESD fingers. All the gates of the HV NMOS devices 312 may be connected together and grounded through a resistor ensuring a time constant (Rground*Cgate) of preferably about 30 microseconds. Additionally, drain-to-gate coupling may be required. Adaptive gate coupling may be used as well. Adding an N+diffusion contact 310 for creating the emitter of the main ESD NPN device 306 and ground return contacts 320 increases the area of the unit ESD cell. Increasing the area required for the unit ESD cell is counter intuitive to an integrated circuit designer who will avoid increased ESD cell area since area is critical in integrated circuit designs. However, the benefit of homogeneous finger triggering at substantially the same time is significantly higher than being able to place more fingers 300 in a given integrated circuit die area.

Practically, the semiconductor device structure shown in FIG. 3 may be very sensitive. Thus a base-to-emitter resistor 326 is preferred in order to prevent the ESD device(s) from triggering on a glitch. Since all of the base-to-emitter resistors 326 and 328 are connected in parallel through the distributed base connection 316, the effective base-emitter resistance, Rbe, is low thereby requiring significant current flowing in the faster finger 300 for triggering the whole ESD structure. Ballasting may be used in both collector/drain and emitter sides for minimizing effects of local heating and/or local thermal run away.

Figure 4B:
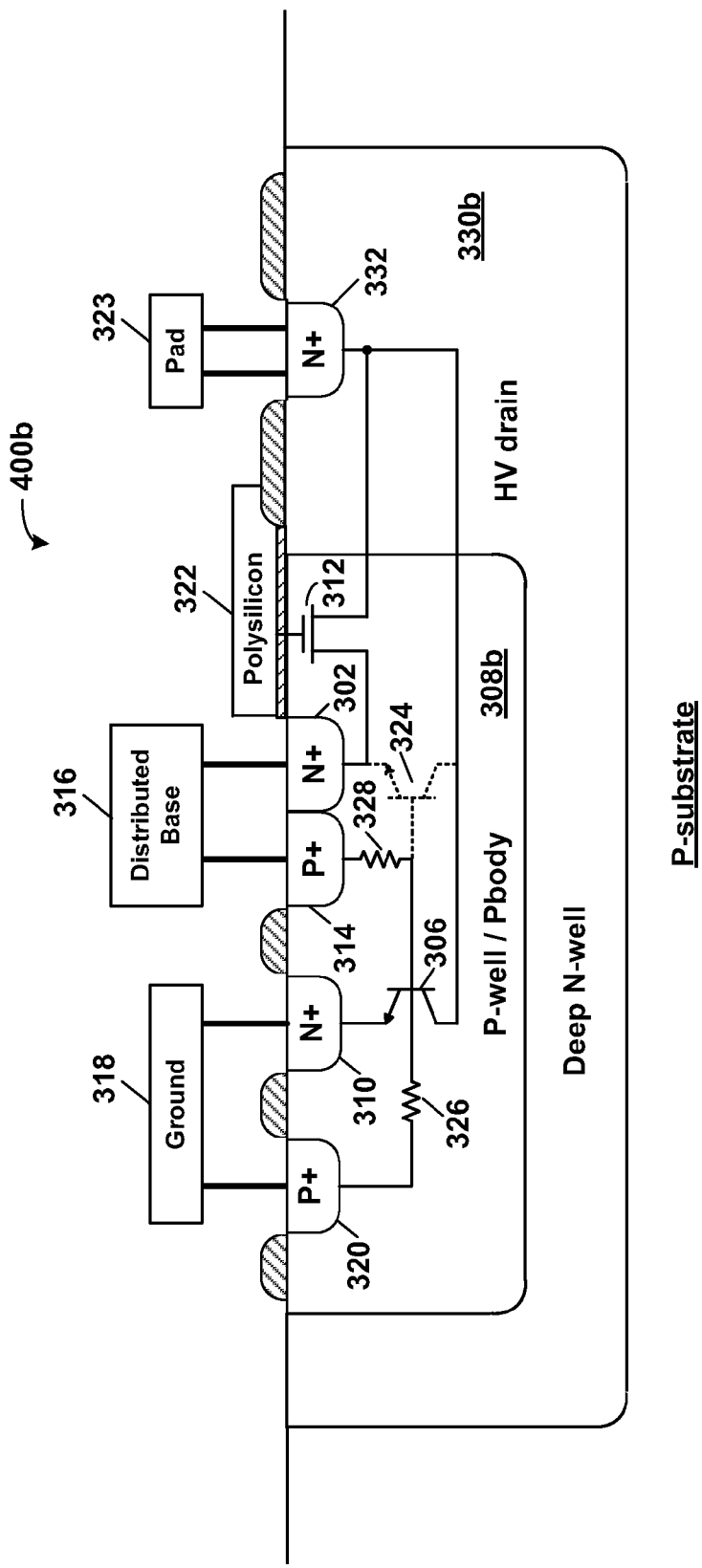
FIG. 4B illustrates a schematic cross-section elevational diagram of a grounded gate lateral N-type diffusion metal oxide semiconductor (NDMOS) ESD protection circuit in an integrated circuit die, according to another specific example embodiment of this disclosure.

Referring to FIG. 4A, depicted is a schematic cross-section elevational diagram of a grounded gate NMOS ESD protection circuit on an isolated substrate and fabricated in an integrated circuit die, according to another specific example embodiment of this disclosure. The circuit shown in FIG. 4A functions in substantially the same way as the grounded gate NMOS ESD protection circuit shown in FIG. 3 with the addition of an isolation substrate 334, e.g., like triple well or SOI processes where the N-well HV drain is no longer built inside the P-substrate but is butted to the P-Well/Pbody 308 of the GGNMOS. FIG. 4B shows a cross-section elevational diagram of a grounded gate lateral N-type diffusion metal oxide semiconductor (NDMOS) ESD protection circuit. These various implementations have no significant impact on the overall behavior of the invention, according to the teachings of this disclosure.

Figure 4C:
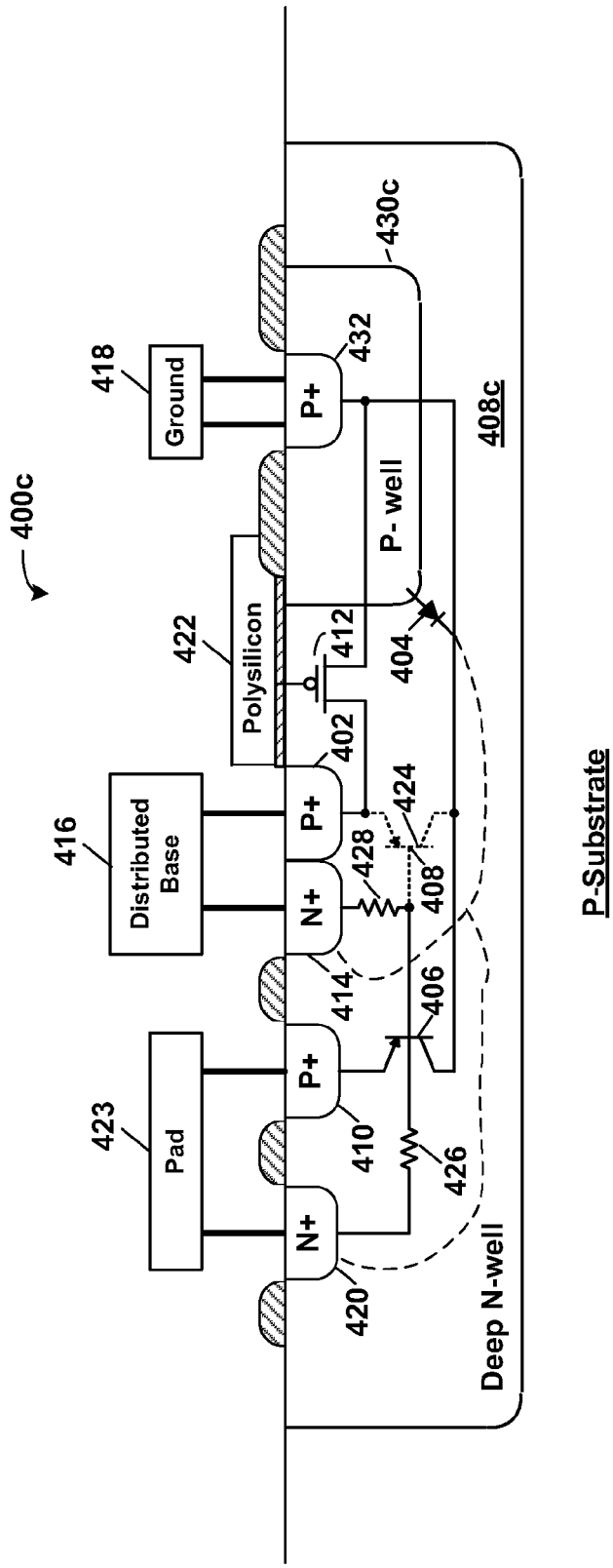
FIG. 4C illustrates a schematic cross-section elevational diagram of a "grounded gate" PDMOS ESD protection circuit in an integrated circuit die, according to another specific example embodiment of this disclosure.

According to the teachings of this disclosure, all embodiments described and claimed herein may be applied to HV PMOS or HV PDMOS technologies as well as the embodiment shown in FIG. 4C. All devices previously described herein become complementary: The high voltage (HV) DMOS device 430 drain is connected to the ground pad 418 through an P+diffusion contact 432. A source thereof is formed from a P+diffusion area local source contact 402 butted with the local N+diffusion base contact 414 and is connected to the distributed base connection 416. A P+diffusion contact 410 is placed next to the local N+diffusion butting contact 414 and becomes the emitter of the PNP bipolar device 406. The collector of the PNP bipolar device 406 is formed with the P-Well 430 which also forms the drain of the HV MOS device 412. This HV-drain/collector is connected to the ground pad 418 through the P+diffusion contact 432. A polysilicon layer 422 over a thin oxide forms the gate of the HV MOS device 412. A second substrate N+diffusion contact 420 is connected to the pad connection 423 and is added next to the P+diffusion contact 410. The P+diffusion contact 410 forms the emitter of the PNP bipolar device 406. The substrate resistance between the second substrate P+diffusion contact 420 and P+diffusion contact (emitter) 410 implements a base-to-emitter resistor 426. The base-to-emitter resistor 426 is needed to prevent early/unwanted triggering on pad glitches. As mentioned hereinabove for the HVNMOS implementation, the base-to-emitter resistor 426 shall be weak (higher resistance) to maximize mutual triggering of the fingers. The gate of the HV PMOS device 412 may be connected to the distributed base connection 416 through a resistor (not shown) or to an ESD clamp triggering circuit 110, e.g., see FIG. 1. HV-PMOS current induced through appropriate gate coupling significantly helps in delivering a base current into each finger 400c, according to the teachings of this disclosure.

Figure 4D:
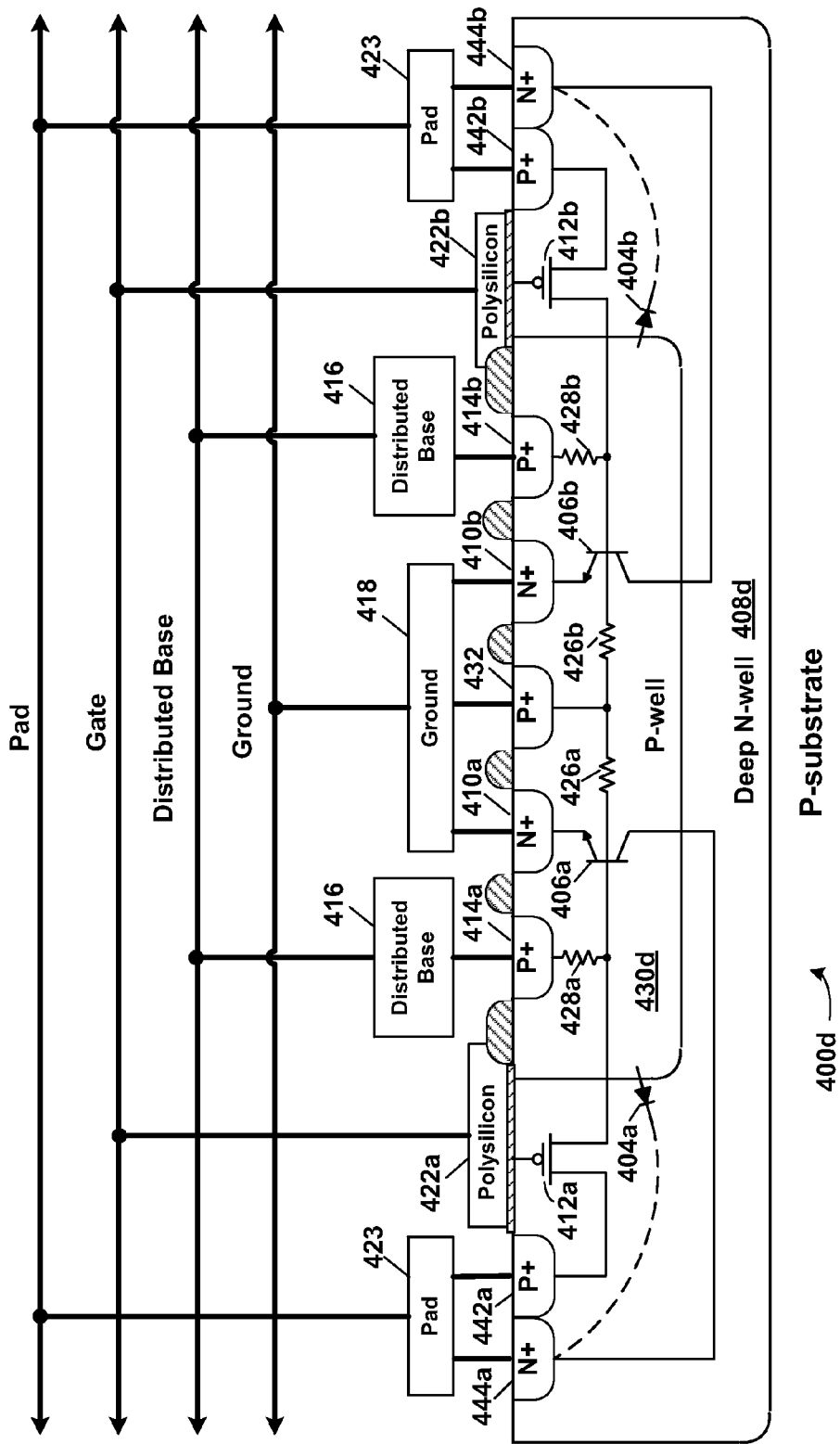
FIG. 4D illustrates a schematic cross-section elevational diagram of a "grounded gate" PDMOS ESD protection circuit where the distributed base connection is moved to the drain side in an integrated circuit die, according to another specific example embodiment of this disclosure.

Usually the PNP companion device associated with PMOS transistors is less efficient during an ESD event than the NPN companion device of a NMOS transistor. Moving the ESD protection, according to the teachings of this disclosure, to the drain side of the HV-PMOS transistor is shown in FIG. 4D. FIG. 4D depicts a schematic cross-section elevational diagram of a central drain "grounded gate" dual HV-PMOS ESD protection circuit fabricated in an integrated circuit die, according to another specific example embodiment of this disclosure. The HV drain P-Well 430 of the dual HV-PMOS transistors 412a and 412b is extended out of the central drain contact 432 in order to be able to add new diffusions therein. Two P+diffusions 414a and 414b are added sufficiently far from the P+diffusion central drain contact 432 in order to be able to implement N+diffusion 410a between P+diffusion 414a and the central drain contact 432, and the N+diffusion 410b between P+diffusion 414b and central drain contact 432. N+diffusions 410a and 410b implement the emitters of created NPN transistors 406a and 406b while the central drain contact 432 of the dual HV-PMOS transistors 412a and 412b also becomes a return contact for the base-to-emitter resistors 426a and 426b of these added NPN transistors 406a and 406b. The N+diffusion body contacts 444a and 444b for the HV-PMOS transistors 412a and 412b act as well as collector contacts for the NPN transistors 406a and 406b while added P+diffusions 414a and 414b are used as contacts for the distributed base 416. The triggering current for the ESD protection is created either through leakage current of drain-to-body diodes 404a and 404b and/or MOS current via appropriate gate coupling for HV-PMOS transistors 412a and 412b.

Figure 5:
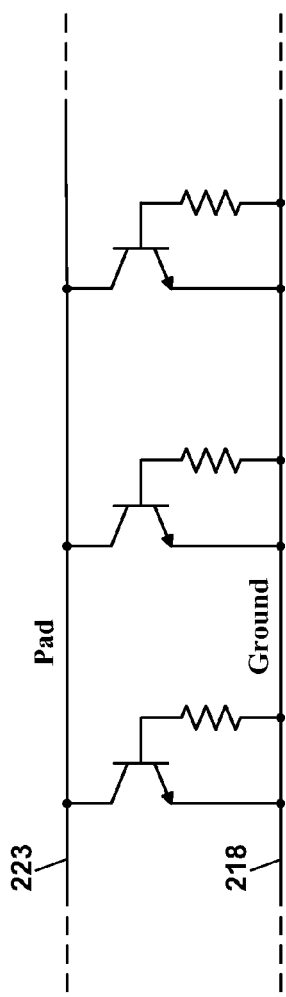
FIG. 5 illustrates a schematic circuit diagram of the prior art grounded gate NMOS ESD protection circuit shown in FIG. 2.
Figure 6:
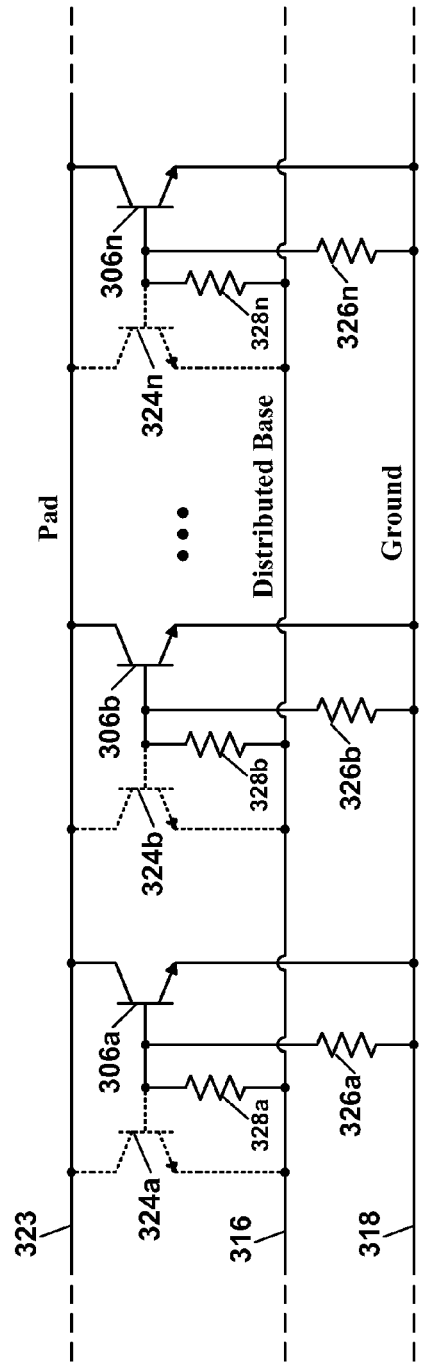
FIG. 6 illustrates a schematic circuit diagram of the grounded gate NMOS ESD protection circuits shown in FIGS. 3 and 4.

Referring to FIGS. 5 and 6, depicted are schematic circuit diagrams of the intrinsic NPN devices in a prior art ESD protection shown in FIG. 2, and the intrinsic NPN devices in the new GGNMOS ESD protection shown in FIG. 3, respectively. The secondary contribution NPN devices 324 are depicted as dashed lines in FIG. 6. The main reason why some fingers are not triggering is that the minimum energy (base current) required to trigger these fingers wasn't injected/accumulated in their bases when the faster finger starts snapping back and dropping out the pad/pin voltage. This base current is injected through the leakage current of the drain junction of the GGNMOS device 312 when the voltage is close to its break-down voltage. Thus dropping the pad/pin voltage stops the leakage and base current injection. The circuit implementations showed in FIGS. 3 and 6 share the base currents of each finger between all the fingers, thereby improving mutual triggering of the ESD fingers 300. When one finger is triggering its base current starts increasing dramatically due to the avalanche effect in this finger. The excess of current is distributed to the other fingers thereby helping them to reach their snapback point.

Referring to FIG. 7, depicted is a schematic isometric diagram of the grounded gate NMOS ESD protection circuit shown in FIG. 3. As described hereinabove, the weak ground-return path/large grounding resistance 326 may be achieved by placing only a few minimally sized grounding P+substrate contact islands 320 into the wide N+ emitter diffusion 310. This facilitates creation of a weak ground return path and a wide emitter diffusion using a minimal area of the integrated circuit die.

Figure 8:
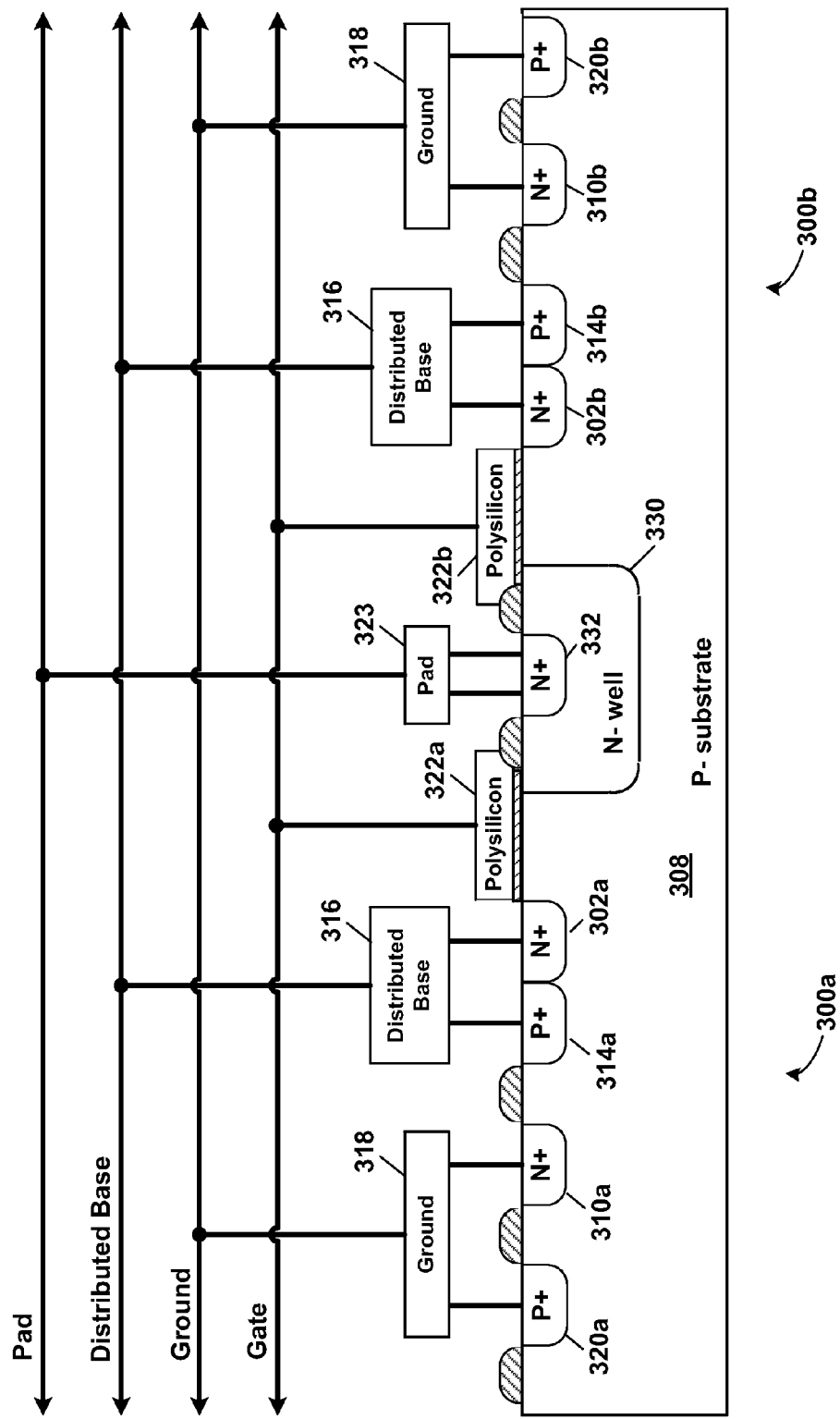
FIG. 8 illustrates a schematic cross-section elevational diagram of a grounded gate NMOS ESD protection circuit showing a plurality of ESD fingers fabricated in an integrated circuit die, according to specific example embodiments of this disclosure.

Referring to FIG. 8, depicted is a schematic cross-section elevational diagram of a grounded gate NMOS ESD protection circuit showing a plurality of ESD fingers fabricated in an integrated circuit die, according to specific example embodiments of this disclosure. A common N-well 330 may be part of at least two finger structures as shown for fingers 300a and 300b. This combination may be repeated over an area of the integrated circuit die.

An advantage of the present invention is that it maximizes ESD robustness of HV ESD protection through homogeneous current sharing between ESD fingers. Further features and advantages of the present invention include but are not limited to: 1) dramatic improvement of current matching between ESD fingers, 2) maximizes efficiency of HV ESD protection, 3) compliant with bulk and trench isolated (SOI) technologies, 4) applicable to CAN, LIN and many other HV products, and 5) meets very stringent requirements, e.g., automotive application.

Figure 9:
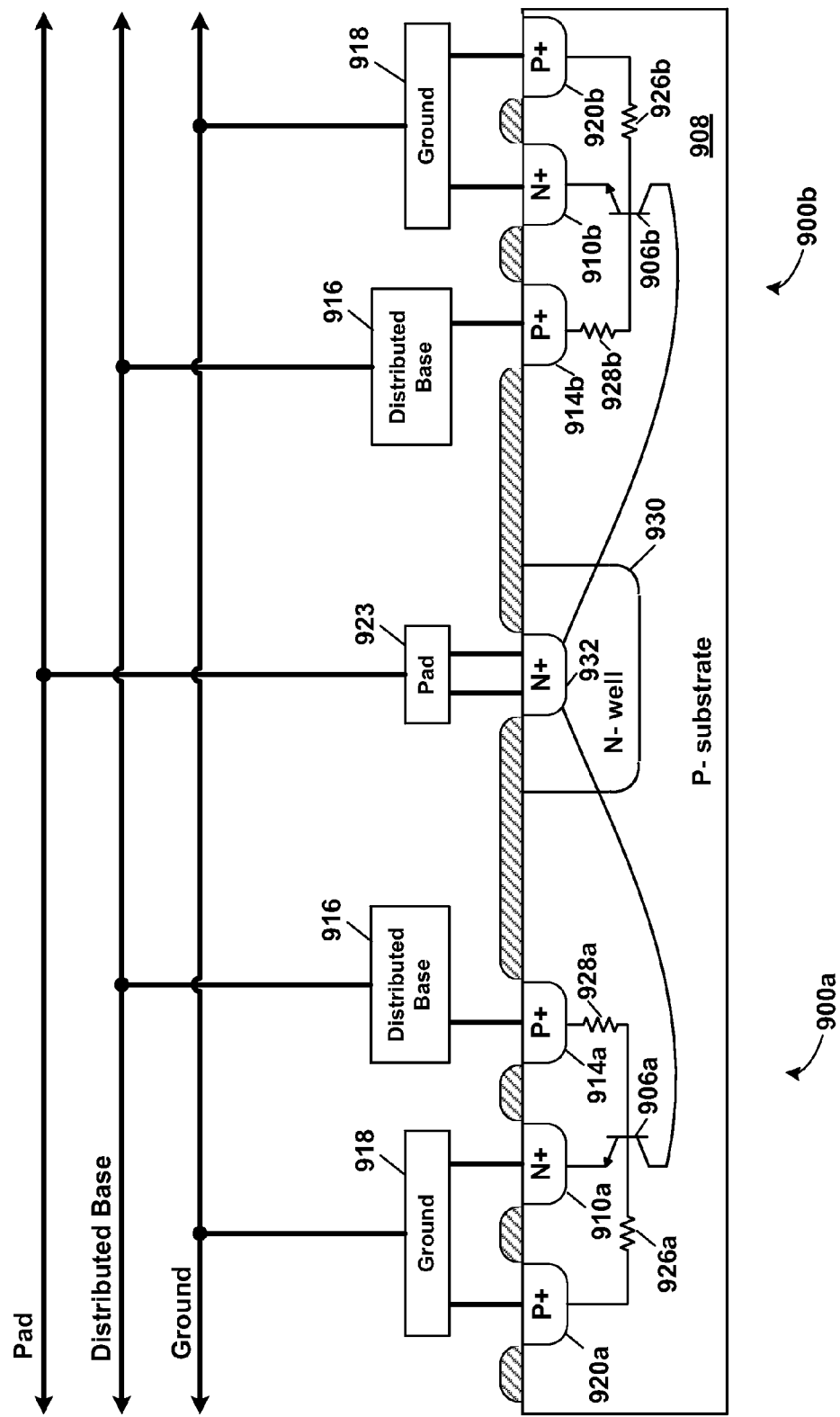
FIG. 9 illustrates a schematic cross-section elevational diagram of a NPN only ESD protection circuit showing a plurality of ESD fingers fabricated in an integrated circuit die, according to specific example embodiments of this disclosure.

According to the teachings of this disclosure, all embodiments described and claimed herein apply as well to bipolar only protection (FIG. 9). A bipolar only implementation is achieved when the polysilicon gates 322 and source contacts 302 are removed. Only the distributed base contacts 316 are maintained. The secondary bipolar transistor 324 disappears, but triggering through the gate is no longer possible.

Referring to FIG. 9, depicted is a schematic cross-section elevational diagram of a NPN only ESD protection circuit showing a plurality of ESD fingers fabricated in an integrated circuit die, according to specific example embodiments of this disclosure. The collectors of the NPN bipolar devices 906a and 906b are formed with the N-well 930 which is coupled to the signal pad 923 through the N+diffusion 932.

The contacts formed by the N+diffusions 910a and 910b are built in the P-substrate 908 and form the emitters of the NPN bipolar devices 906a and 906b. First P+diffusion substrate contacts 914a and 914b are placed between the N-well 930 (collectors) and the emitters formed by the N+diffusions 910a and 910b. The P+diffusions 914a and 914b are coupled to the distributed base 916 through parasitic resistances 928a and 928b. Second P+diffusion substrate contacts 920a are 920b are added external to the N+diffusions 910a and 910b (emitters) and connect the base-emitter resistances 926a and 926b to the ground connection 918. As mentioned hereinabove the base-to-emitter resistor 926 resistor shall be weak (higher resistance) to maximize mutual triggering of the fingers 900.

Figure 10:
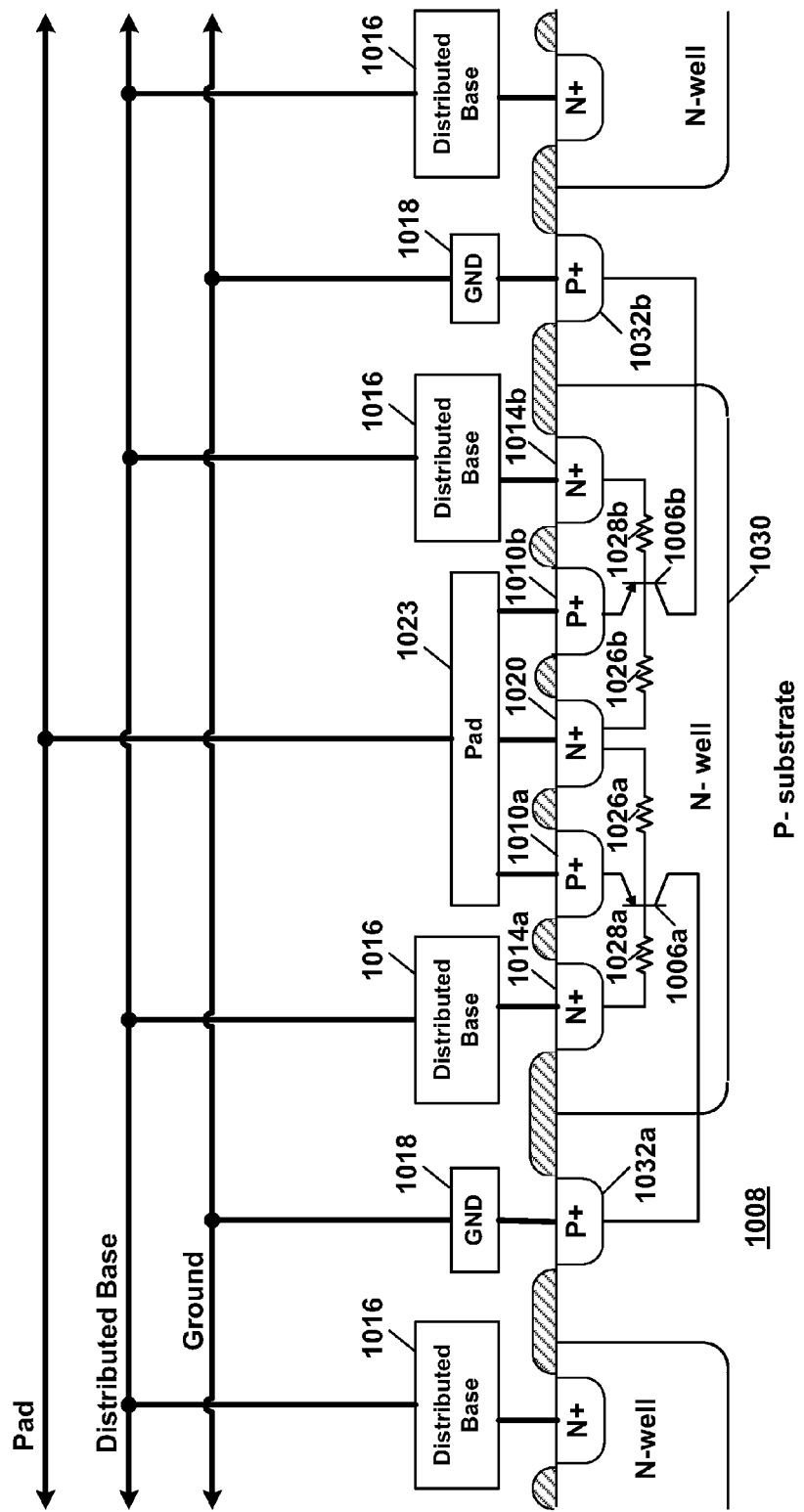
FIG. 10 illustrates a schematic cross-section elevational diagram of a PNP ESD protection circuit showing a plurality of ESD fingers on an isolated substrate and fabricated in an integrated circuit die, according to specific example embodiments of this disclosure.

Referring to FIG. 10, depicted is a schematic cross-section elevational diagram of a PNP ESD protection circuit showing a plurality of ESD fingers on an isolated substrate and fabricated in an integrated circuit die, according to another specific example embodiment of this disclosure. Dual high voltage (HV) PNP devices 1006a and 1006b have their emitters formed from P+diffusions 1010a and 1010b, respectively, built in the N-Well base 1030. The dual emitter P+diffusions 1010a and 1010b are tied to pad connection 1023. Dual N+diffusions 1014a and 1014b tie the parasitic dual resistors 1028a and 1028b to the distributed base 1016, and N+diffusion 1020 ties the emitter-base resistances 1026a and 1026b to the pad connection 1023. The P-substrate 1008 constitutes the collectors of the dual HV PNP devices 1006a and 1006b, and is tied to the ground connection 1018 through dual P+diffusion contacts 1032a and 1032b.

Figure 11:
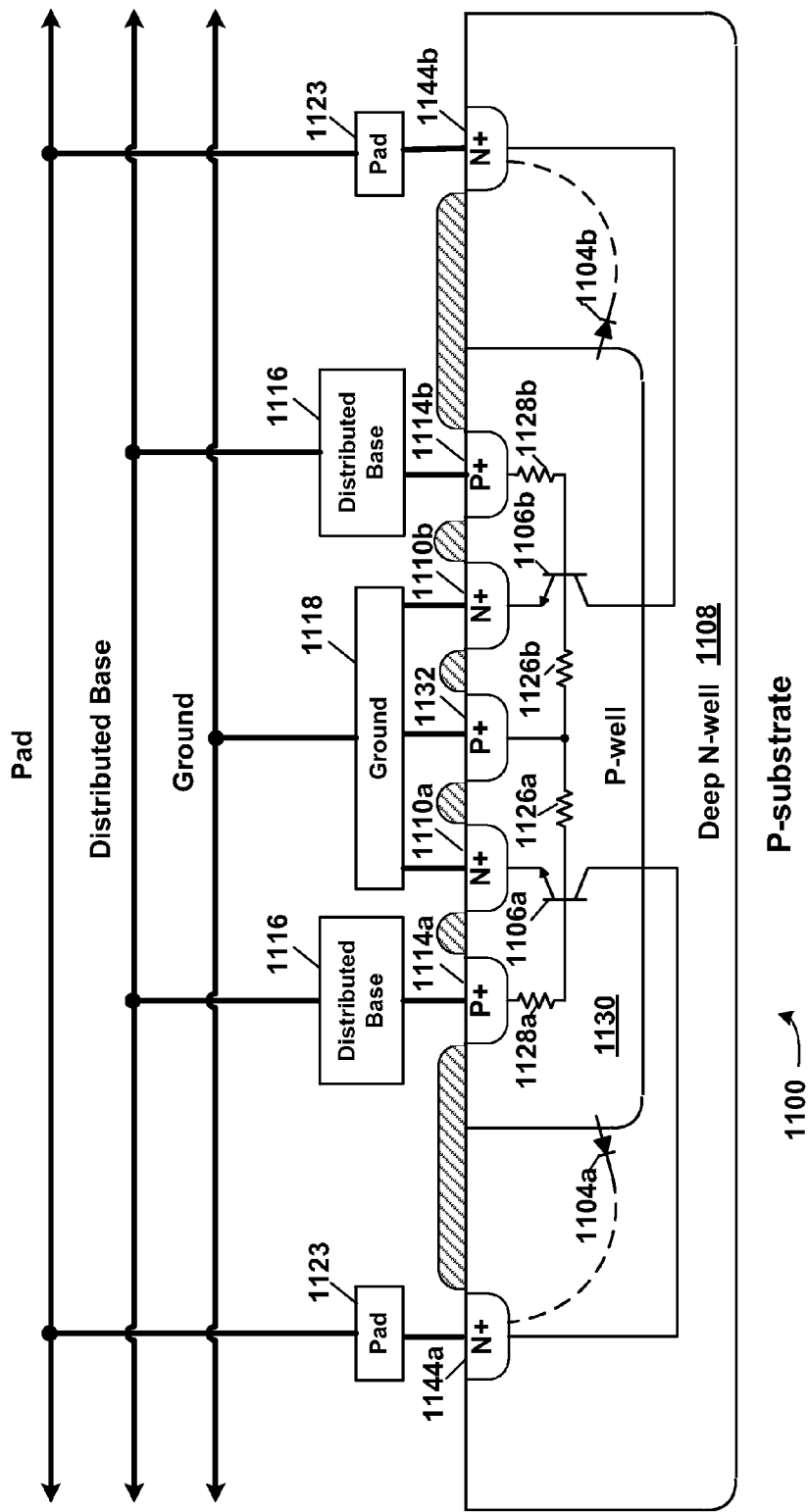
FIG. 11 illustrates a schematic cross-section elevational diagram of an isolated NPN ESD protection circuit fabricated in an integrated circuit die, according to another specific example embodiment of this disclosure.

Referring to FIG. 11, depicted is a schematic cross-section elevational diagram of an isolated NPN ESD protection circuit fabricated in an integrated circuit die, according to another specific example embodiment of this disclosure. This structure is based on FIG. 4D where the HV-PMOS 412a/b have been removed. The collectors of the NPN bipolar devices 1106a and 1106b are formed with the Deep-N-well 1108 which is coupled to the signal pad 1123 through the N+diffusion 1144a and 1144b. The HV P-Well 1130 (that was the drain of HV-PMOS in FIG. 4D) is the base of dual isolated NPN 1106a and 1106b. The central P+diffusion contact 1132 is the ground return base contact. Two P+diffusions 1114a and 1114b are added sufficiently far from the central P+diffusion ground return base contact 1132 in order to be able to implement N+diffusion 1110a between P+diffusion 1114a and the ground return base contact 1132, and the N+diffusion 1110b between P+diffusion 1114b and central P+diffusion ground return base contact 1132. N+diffusions 1110a and 1110b implement the emitters of created isolated NPN transistors 1106a and 1106b. The central P+diffusion 1132 implements the return contact for the base-to-emitter resistors 1126a and 426b of the isolated NPN transistors 1106a and 1106b while the added P+diffusions 1114a and 1114b are used as contacts for the distributed base 1116 through the local resistors 1128a and 1128b. As mentioned hereinabove the base-to-emitter resistors 1126a and 1126b shall be weak (higher resistance) while local resistors 1128a and 1128b shall be as low as possible in order to maximize mutual triggering of the bipolar 1106a and 1106b. The triggering current for the ESD protection is created through leakage current of collector-to-base diodes 1104a and 1104b.

For all of the embodiments described hereinabove, the pad to protect is assumed to be positive versus ground. Elsewhere process intrinsic diodes are forward biased clamping the pad voltage a junction voltage (~0.7V) below the ground voltage. Protecting a pad versus ground is the most common situation. However some application may require protecting the pad versus a positive supply like the battery voltage (Vbat).

According to the teachings of this disclosure, the techniques described herein apply as well to such a situation when the isolated protection presented in FIG. 4A, 4B, 4C, 4D or 11 are used. In order to explain how it works the pad termination 323, 423 or 1123 is renamed the positive termination while the ground termination 318, 418 or 1118 is renamed negative termination. Protecting the pad versus the positive voltage is achieved by connecting the positive terminations 323, 423 or 1123 to the positive voltage while negative terminations 318, 418 or 1118 is connected to the pad to be protected.

It is contemplated and within the scope of this disclosure that one having ordinary skill in integrated circuit design and the benefit of this disclosure could effectively apply the new ESD circuits disclosed herein to any basic bulk process (e.g. for LIN application) or BCD, BiCMOS, triple well, SOI, etc. The main difference is that such processes may have more layers that are not shown in the basic descriptions of the embodiments presented hereinabove.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An apparatus for electrostatic discharge (ESD) protection, comprising:
a plurality of ESD fingers coupled with a signal pad connection,
wherein each of the plurality of ESD fingers comprises
first and second NPN bipolar transistors, wherein an emitter of the first NPN bipolar transistor is connected with a ground connection and bases of the first and second NPN bipolar transistors are coupled via a first resistor with the ground connection,
and wherein an emitter of the second NPN bipolar transistor is connected with a distributed base connection, and the bases of the first and second NPN bipolar transistors are coupled via a second resistor with the distributed base connection.

2. The apparatus according to claim 1, wherein each of the plurality of ESD fingers further comprises:
an NMOS device comprising
a high voltage drain formed by an N-well formed in a P-substrate and coupled to the signal pad through an N+diffusion contact in the N-well,
a gate formed by the polysilicon layer over the P-substrate and insulated therefrom by a thin oxide layer therebetween, and
a source formed by a first N+diffusion contact in the P-substrate and coupled to the distributed base connection;
wherein the first NPN bipolar device comprising
a collector formed by the N-well,
a base formed by the P-substrate, and
an emitter formed by a second N+diffusion contact in the P-substrate and coupled to the ground connection;
wherein the second NPN bipolar device comprising
a collector formed by the N-well,
a base formed by the P-substrate, and
an emitter formed by the first N+diffusion contact in the P-substrate;

a first P+diffusion contact in the P-substrate and coupled to the distributed base connection, wherein the first P+diffusion contact is butted proximate to the first N+diffusion contact; and a second P+diffusion contact in the P-substrate and coupled to the ground connection.

3. The apparatus according to claim 2, wherein the second NPN bipolar device is a secondary contribution NPN bipolar device to the first NPN bipolar device.

4. The apparatus according to claim 2, wherein
the first resistor is formed in the P-substrate that couples the bases of the first NPN bipolar device and the second NPN bipolar device to the first P+diffusion contact; and
the second resistor is formed in the P-substrate that couples the base of the first NPN bipolar device and the second NPN bipolar device to the second P+diffusion contact.

5. The apparatus according to claim 4, wherein the first resistor is an unwanted parasitic resistor while second is desired.

6. The apparatus according to claim 4, wherein the second resistor is higher in resistance than the first resistor for maximizing mutual triggering of the plurality of ESD fingers.

7. The apparatus according to claim 2, wherein the gate formed by the polysilicon layer is coupled to the distributed base connection.

8. The apparatus according to claim 2, wherein the gate formed by the polysilicon layer is coupled to the distributed base connection through a resistor.

9. The apparatus according to claim 2, wherein the gate formed by the polysilicon layer is coupled to the ground connection through a resistor.

10. The apparatus according to claim 2, wherein the gate formed by the polysilicon layer is coupled to the ground connection.

11. The apparatus according to claim 2, wherein the gate formed by the polysilicon layer is coupled to an ESD clamp triggering circuit.

12. The apparatus according to claim 1, wherein each of the plurality of ESD fingers comprises:
an NMOS device comprising
a high voltage drain formed by an N-well butted to a P-well body and coupled to the signal pad through an N+diffusion contact in the N-well,
a gate formed by the polysilicon layer over the P-well body and insulated therefrom by a thin oxide layer therebetween, and
a source formed by a first N+diffusion contact in the P-well body and coupled to the distributed base connection;
wherein the first NPN bipolar device comprises
a collector formed by the N-well,
a base formed by the P-well body, and
an emitter formed by a second N+diffusion contact in the P-well body;
wherein the second NPN bipolar device comprises
a collector formed by the N-well,
a base formed by the P-well body, and
an emitter formed by the first N+diffusion contact in the P-well body;
a first P+diffusion contact in the P-well body and coupled to the distributed base connection, wherein the first P+diffusion contact is butted proximate to the first N+diffusion contact;
a second P+diffusion contact in the P-well body and coupled to the ground connection; and
an isolation substrate having the P-well body and the N-well deposed thereon.

13. The apparatus according to claim 12, wherein the second NPN bipolar device is a secondary contribution NPN bipolar device to the first NPN bipolar device.

14. The apparatus according to claim 12, wherein the signal pad connection is connected to a positive supply while the ground connection is connected to a signal pad to be protected.

15. The apparatus according to claim 12, wherein
the first resistor is formed in the P-well body that couples the bases of the first NPN bipolar device and the second NPN bipolar device to the first P+diffusion contact; and
the second resistor is formed in the P-well body that couple the bases of the first NPN bipolar device and the second NPN bipolar device to the second P+diffusion contact.

16. The apparatus according to claim 15, wherein the first resistor is an unwanted parasitic resistor while the second is a desired parasitic resistor.

17. The apparatus according to claim 15, wherein the second resistor is higher in resistance than the first resistor for maximizing mutual triggering of the plurality of ESD fingers.

18. The apparatus according to claim 12, wherein the gate formed by the polysilicon layer is coupled to the distributed base connection.

19. The apparatus according to claim 12, wherein the gate formed by the polysilicon layer is coupled to the ground connection through a resistor.

20. The apparatus according to claim 12, wherein the gate formed by the polysilicon layer is coupled to an ESD clamp triggering circuit.

21. The apparatus according to claim 1, wherein each of the plurality of ESD fingers further comprises:
an NMOS device comprising
a high voltage (HV) drain formed by a deep N-well surrounding a P-well body and coupled to the signal pad connection through an N+diffusion contact in the deep N-well,
a gate formed by the polysilicon layer over the P-well body and insulated therefrom by a thin oxide layer therebetween, and
a source formed by a first N+diffusion contact in the P-well body and coupled to the distributed base connection;
wherein the first NPN bipolar device comprises
a collector formed by the deep N-well,
a base formed by the P-well body, and
an emitter formed by a second N+diffusion contact in the P-well body;
wherein the second NPN bipolar device comprises
a collector formed by the deep N-well,
a base formed by the P-well body, and
an emitter formed by the first N+diffusion contact in the P-well body;
a first P+diffusion contact in the P-well body and coupled to the distributed base connection, wherein the first P+diffusion contact is butted proximate to the first N+diffusion contact;
a second P+diffusion contact in the P-well body and coupled to the ground connection; and
a P-substrate having the deep N-well formed therein.

22. The apparatus according to claim 21, wherein the second NPN bipolar device is a secondary contribution NPN bipolar device to the first NPN bipolar device.

23. The apparatus according to claim 5, wherein the first base resistor is an unwanted parasitic resistor while second resistor is a desired parasitic resistor.

24. The apparatus according to claim 5, wherein the second resistor is higher in resistance than the first resistor for maximizing mutual triggering of the plurality of ESD fingers.

25. The apparatus according to claim 21, wherein the gate formed by the polysilicon layer is coupled to the distributed base connection.

26. The apparatus according to claim 21, wherein the gate formed by the polysilicon layer is coupled to the distributed base connection through a resistor.

27. The apparatus according to claim 21, wherein the gate formed by the polysilicon layer through a resistor.

28. The apparatus according to claim 21, wherein the gate formed by the polysilicon layer is coupled to the ground connection.

29. The apparatus according to claim 21, wherein the gate formed by the polysilicon layer is coupled to an ESD clamp triggering circuit.

30. The apparatus according to claim 21, wherein the signal pad connection is connected to a positive supply while the ground connection is connected to a signal pad to be protected.

\* \* \* \* \*

UNITED STATES PATENT AND TRADEMARK OFFICE
CERTIFICATE OF CORRECTION

PATENT NO.         : 8,735,979 B2
APPLICATION NO.    : 13/552751
DATED              : May 27, 2014
INVENTOR(S)        : Philippe Deval et al.

Page 1 of 1

It is certified that error appears in the above-identified patent and that said Letters Patent is hereby corrected as shown below:

In the Claims:

Column 16,
Claim 1, lines 34-35 "…a plurality of ESD fingers coupled with a signal pad connection…"
---Change to--- "…a plurality of ESD fingers coupled with a signal pad…"

Column 17,
Claim 5, line 19 "…resistor is an unwanted parasitic resistor while second is…" ---Change to---
"…resistor is an unwanted parasitic resistor while second resistor is…"

Column 17,
Claim 12, line 42 "…a high voltage drain formed by an N-well butted to a P-well…" ---Change to---
"…a high voltage (HV) drain formed by an N-well butted to a P-well…"

Column 18,
Claim 16, line 16 "…resistor is an unwanted parasitic resistor while the second is a…" ---Change to---
"…resistor is an unwanted parasitic resistor while the second resistor is a…"

Column 18,
Claim 23, line 63 "…base resistor is an unwanted parasitic resistor while second…" ---Change to---
"…resistor is an unwanted parasitic resistor while second…"

Column 19,
Claim 27, line 8 "…formed by the polysilicon layer through a resistor…" ---Change to---
"…formed by the polysilicon layer is coupled to the distributed base connection through a resistor…"

Signed and Sealed this
Thirtieth Day of September, 2014

Michelle K. Lee
*Deputy Director of the United States Patent and Trademark Office*